(12) United States Patent
Arai

(10) Patent No.: US 8,575,604 B2
(45) Date of Patent: Nov. 5, 2013

(54) SEMICONDUCTOR MEMORY DEVICE

(75) Inventor: Yasuyuki Arai, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/293,260

(22) Filed: Nov. 10, 2011

(65) Prior Publication Data

US 2012/0126224 A1    May 24, 2012

(30) Foreign Application Priority Data

Nov. 19, 2010    (JP) ................................. 2010-259547

(51) Int. Cl.
    *H01L 27/105*      (2006.01)
    *H01L 21/16*      (2006.01)

(52) U.S. Cl.
    USPC ............................................ 257/43; 257/296

(58) Field of Classification Search
    USPC ................ 257/43, E29.068, 68, 71, 296–346, 257/E27.084, E29.129, E21.179, E21.422; 438/326, 306
    See application file for complete search history.

(56) References Cited

U.S. PATENT DOCUMENTS

| 5,757,693 | A | 5/1998 | Houghton et al. |
| 6,489,195 | B1 * | 12/2002 | Hwang et al. ............... 438/238 |
| 6,703,657 | B2 * | 3/2004 | Hwang et al. ............... 257/296 |
| 2010/0148171 | A1 | 6/2010 | Hayashi et al. |

FOREIGN PATENT DOCUMENTS

| JP | 02-054572 | 2/1990 |
| JP | 06-326272 | 11/1994 |
| JP | 10-241358 | 9/1998 |
| JP | 2010-141230 | 6/2010 |

* cited by examiner

*Primary Examiner* — Asok K Sarkar
*Assistant Examiner* — Dmitriy Yemelyanov
(74) *Attorney, Agent, or Firm* — Eric J. Robinson; Robinson Intellectual Property Law Office, P.C.

(57) ABSTRACT

An object is to provide a semiconductor memory device which can be miniaturized and also secures a sufficient margin for the refresh period. A memory cell includes a reading transistor, a writing transistor, and a capacitor. In the above structure, the capacitor controls a potential applied to a gate of the reading transistor. The writing transistor controls writing and erasing of data and, when the transistor is off, has small current so that loss of electric charges stored in the capacitor, which is due to leakage current of the writing transistor, can be prevented. A semiconductor layer included in the writing transistor is provided so as to extend from the gate electrode toward a source region of the reading transistor. The capacitor is provided to overlap with the gate electrode of the reading transistor.

8 Claims, 12 Drawing Sheets

SEMICONDUCTOR MEMORY DEVICE

BACKGROUND OF THE INVENTION

1. Field of the Invention

An embodiment of the present invention relates to a semiconductor memory device. An embodiment of the invention to be disclosed includes a structure of a memory cell and a structure of an element included in the memory cell.

2. Description of the Related Art

As a memory cell in a semiconductor memory, one including two transistors (a reading transistor and a writing transistor), one capacitor, and one diode is known (for example, see Patent Document 1 and Patent Document 2). In this memory cell, a gate of the reading transistor is connected to the capacitor, and the writing transistor connected to a bit line for writing controls the charge and discharge of the capacitor. With this structure, storage and erasing of data is performed.

It is only necessary that the capacitor in the above memory cell has capacitance high enough to turn the reading transistor on; thus, the capacitor in the above memory cell has an advantage of having a smaller area than a dynamic random access memory (RAM) including one transistor and one capacitor.

However, in the memory cells each disclosed in Patent Document 1 and Patent document 2, electric charges stored in the capacitor are lost over time due to leakage current of the writing transistor even when the writing transistor is off, which is similar to the dynamic RAM. Therefore, in the case where a semiconductor memory device including the above memory cell operates, there is a problem in that data rewriting operation (refresh operation) needs to be performed frequently (every several tens of milliseconds) in order to hold the stored data.

In addition, the semiconductor memory device needs to have densely arranged memory cells in order to increase storage capacity. However, in the semiconductor memory including memory cells each of which includes a reading transistor, a writing transistor, and a capacitor as disclosed in Patent Document 1 and Patent Document 2, a word line and a bit line are provided to correspond to the reading transistor and the writing transistor, and thus, there is a problem of difficulty in high integration. Against the problems, a semiconductor memory device in which an area of a memory cell is reduced by employing a writing transistor with a vertical-channel structure provided over a source region of a reading transistor is disclosed (see Patent Document 3).

REFERENCE

[Patent Document 1] Japanese Published Patent Application No. H6-326272
[Patent Document 2] Japanese Published Patent Application No. H10-241358
[Patent Document 3] Japanese Published Patent Application No. H2-054572

SUMMARY OF THE INVENTION

In a structure in which a writing transistor with a vertical-channel structure is provided over a source region of a reading transistor, a transistor is formed over another transistor, which causes a problem of doubling the number of manufacturing steps. Further, in the writing transistor with a vertical-channel structure, a vertical source region and a vertical drain region should be formed by adding an impurity to a semiconductor film formed over the source region of the reading transistor. However, such a process is extremely difficult, and a large margin is needed according to a design rule, which results in failure of miniaturization of the transistors.

Furthermore, the writing transistor with a vertical-channel structure is formed using a polycrystalline silicon film having many defects, unlike the reading transistor formed using a single crystal silicon substrate, and thus characteristics of the writing transistor are poor. Specifically, the transistor formed using a polycrystalline silicon film tends to have a large amount of off-state current. Note that according to Patent Document 3, a semiconductor layer in the transistor is formed by epitaxial growth; however, it is impossible to perform epitaxial growth starting from a contact opening portion in the source region to form a single crystal semiconductor in which a gate electrode is buried. Even if such a semiconductor film could be deposited, the silicon film has many defects, and thus a favorable transistor cannot be obtained.

As described above, in the conventional technique, electric charges stored in the capacitor of the memory cell leak through the writing transistor even when the writing transistor is off. In other words, since electric charges stored in the capacitor leak when the writing transistor is turned off, a time period during which data written to the memory cell can be held is short, and refresh operation is needed in order to hold the stored data.

A memory needing refresh operation is also called a volatile memory. Needless to say, there is a variation in charge holding time between memory cells included in the volatile memory. Therefore, the timing of refresh operation in the volatile memory cell is set with a sufficient margin on the basis of the memory cell with the shortest charge holding time so as to prevent all memory cells from causing defects in storage holding so that each memory cell can operate stably. When the number of memory cells in the volatile memory is increased, time needed for refresh operation is increased, which makes it difficult to have a margin for a cycle of the refresh operation.

Thus, one object of an embodiment of the present invention is to provide a semiconductor memory device which can be miniaturized and also secures a sufficient margin for the refresh period.

A memory cell in a semiconductor memory device includes a first transistor used for reading stored data, a second transistor which controls writing and erasing of data, and a capacitor which holds electric charges stored as data and controls a potential of a gate electrode of the first transistor.

In the above structure, a transistor used as the second transistor controls writing and erasing of data and has a small off-state current so that loss of electric charges stored in the capacitor, which is due to leakage current of the second transistor, can be prevented. Therefore, for a semiconductor forming a channel region of the second transistor, a semiconductor material having a wider band gap than a silicon semiconductor (1.12 eV) is used. For example, a semiconductor material whose band gap is 2.5 eV or more, preferably 3.0 eV or more, is used. As such a semiconductor, an oxide semiconductor, a nitride semiconductor, an oxynitride semiconductor, a carbide semiconductor, or a diamond thin film having semiconductor characteristics can be used.

As the first transistor, a transistor including a silicon semiconductor, i.e., a metal-oxide-semiconductor field effect transistor (MOSFET, hereinafter also referred to as a MOS transistor) can be used. When the MOS transistor including a silicon semiconductor is used as a reading transistor, speed of reading data can be improved.

The memory cell includes: a second transistor in which one of input/output terminals is connected to a bit line, the other terminal is connected to one of terminals of a capacitor, and a gate is connected to a first word line; and a first transistor in which one of input/output terminals is connected to the bit line, the other terminal is connected to a common potential line, and a gate is connected to the other terminal of the second transistor and the one of terminals of the capacitor. Note that the other terminal of the capacitor is connected to a second word line.

In this structure of the memory cell, a semiconductor layer included in the second transistor is provided to extend from a gate electrode toward a source region of the first transistor. The capacitor is provided to overlap with the gate electrode of the first transistor. With this structure, although each memory cell includes two transistors and one capacitor, the density of the memory cells can be increased.

The above description of the invention does not disclose all features needed for the present invention, and the subcombination of the groups of features can also be the invention.

In this specification, a numeral such as "first", "second", or "third" which is included in a term is given for convenience in order to distinguish elements, does not limit the number and does not limit the arrangement and the order of the steps unless otherwise specified.

In this specification, when a component is "over" or "under" another component, the former component may be directly formed on the latter component, or still another component may be provided therebetween.

In this specification, terms in a singular form which are used for description of the embodiments include a concept of plural, unless it is contextually clear that a singular form or a plural form is intentionally used. The word "include" or "have" is used to express the presence of a characteristic, a number, a step, operation, a component, a piece, or combination thereof, and do not eliminate the possibility of presence or addition of one or more other characteristics, numbers, steps, operation, components, pieces, or combination thereof.

In this specification, all the terms which are used including the technical or scientific terms have the same meaning as ones which can be generally understood by those who have conventional knowledge in the technical field to which the present invention belongs. The terms same as ones defined in a commonly-used dictionary should be interpreted as including the meaning in accordance with the meaning in the context of the related art, and should not be interpreted as being ideally or excessively literally unless they are defined clearly in this specification.

As the first transistor, a MOS transistor including a silicon semiconductor is formed, and as the second transistor, a transistor including a semiconductor whose band gap is wider than that of a silicon semiconductor is formed, whereby a time period during which electric charges stored in the capacitor of the memory cell are held can be increased. The time period during which electric charges stored in the capacitor can be held depends on the off-leakage current of the second transistor. When the off-state current is less than or equal to 10 zA (1 zA (zeptoampere) is $1 \times 10^{-21}$ A), a capacitance of 10 fF stored in the capacitor can be hold as data for at least $10^4$ seconds. Therefore, the interval between refresh operations needed for holding data written to the memory cell can be prolonged.

When the data holding time of the memory cell is $10^3$ seconds to $10^4$ seconds, the interval between refresh operations can be sufficiently prolonged as compared to that of the conventional dynamic RAM, even if there is some variation in data holding times between the memory cells. Thus, even when the storage capacity of the semiconductor memory device is increased, stable operation can be secured.

The second transistor which controls writing of data to the memory cell is provided to extend from a gate electrode toward a source region of a MOS transistor, whereby an area occupied by one memory cell can be decreased. That is, even in the case where two transistors are needed to form one memory cell, a first transistor and a second transistor are provided to overlap with each other; thus, memory cells can be formed without increasing the area per cell.

DETAILED DESCRIPTION OF THE INVENTION

Figure 1:
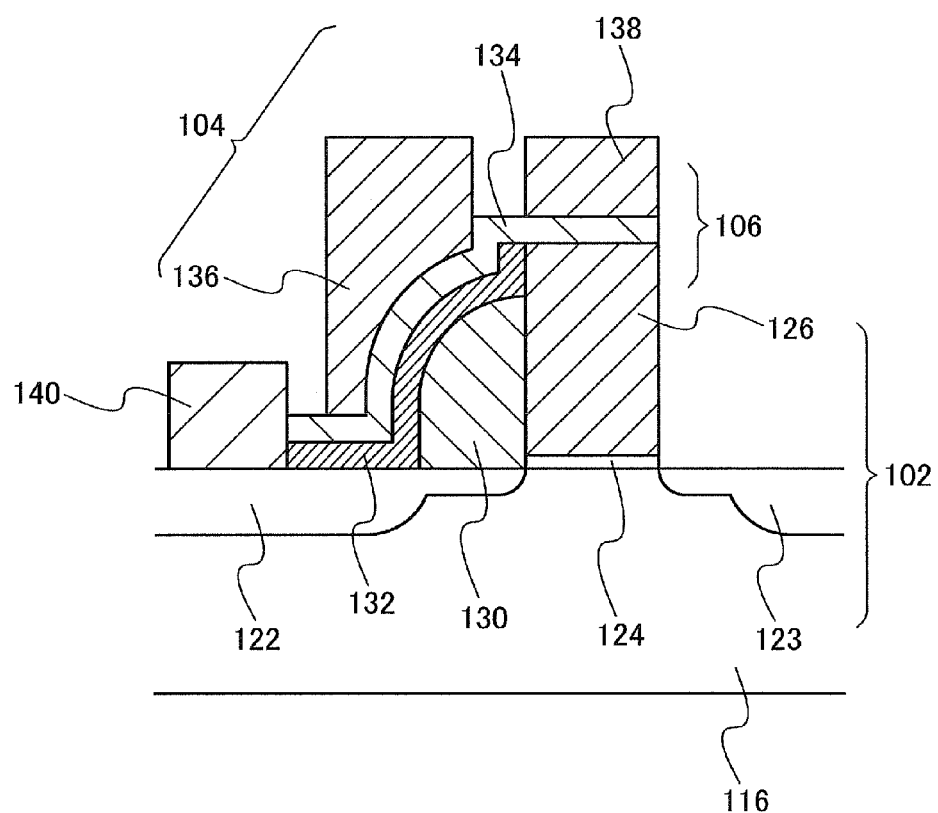
FIG. 1 is a cross-sectional view illustrating a structure of a memory cell.

An embodiment of the disclosed invention will be described with reference to drawings. However, the invention to be disclosed is not limited to the embodiment below, and it is easily understood by those skilled in the art that modes and details can be variously changed without departing from the purpose and the scope of the present invention. Therefore, the disclosed invention is not interpreted as being limited to the description of the embodiment below.

Further, in embodiments hereinafter described, the same parts are denoted with the same reference numerals throughout the drawings. Note that components illustrated in the drawings, that is, a thickness or a width of a layer, a region, or the like, a relative position, and the like are exaggerated in some cases for clarification in description of embodiments.

<Structure of Memory Cell and Equivalent Circuit>

Figure 2:
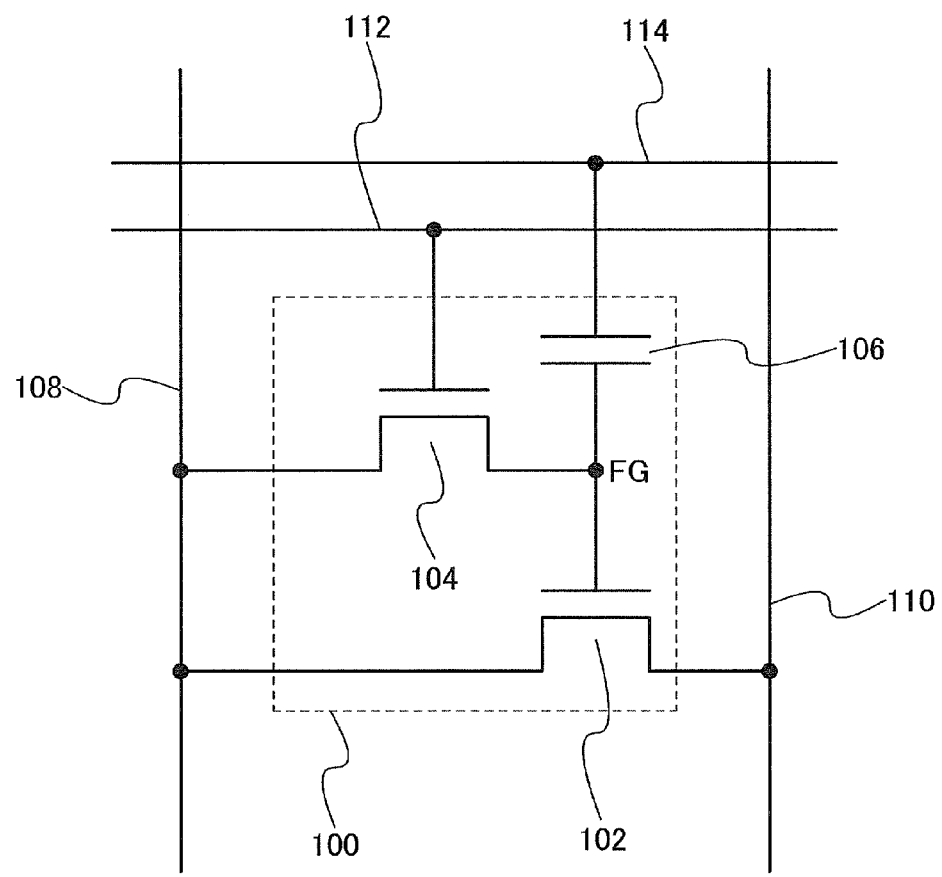
FIG. 2 is an equivalent circuit diagram of the memory cell illustrated in FIG. 1.

A semiconductor memory device according to one embodiment of the present invention will be described with reference to FIG. 1 and FIG. 2. FIG. 1 schematically illustrates a cross-sectional structure of a memory cell in the semiconductor memory device. FIG. 2 shows an equivalent circuit of the memory cell illustrated in FIG. 1. FIG. 1 and FIG. 2 show that a memory cell 100 includes a first transistor 102, a second transistor 104, and a capacitor 106.

A structure of the memory cell is described with reference to FIG. 2. One of input/output terminals (a source and a drain) of the first transistor 102 is connected to a bit line 108, and the other is connected to a common potential line 110. One of input/output terminals (a source and a drain) of the second transistor 104 is connected to the bit line 108, and the other is connected to a control terminal (gate) of the first transistor 102. The control terminal (gate) of the first transistor 102 is connected to one of terminals of the capacitor 106. A control terminal (gate) of the second transistor 104 is connected to a first word line 112 for writing, and the other terminal of the capacitor 106 is connected to a second word line 114 for reading. When the second transistor 104 is off, the gate of the first transistor 102 can be regarded as a floating gate. Thus, in the equivalent circuit of FIG. 2, the portion that can be regarded as a floating gate is indicated as a floating gate portion FG.

FIG. 1 illustrates a state in which the second transistor 104 and the capacitor 106 which are components of the memory cell are provided to overlap with the first transistor 102. Different semiconductor materials are used for portions to be channel formation regions of the first transistor 102 and the second transistor 104. This is because high-speed operation is required for the first transistor 102 in order to read data from the memory cell, and the drain current (off-state current) of the second transistor 104 that is in an off state is required to be small in order not to cause leakage of electric charges stored in the capacitor 106 of the memory cell.

Note that the off-state current refers to a current flowing between a source electrode and a drain electrode when a transistor is in an off state. In the case of an n-channel transistor, the off-state current is a current which flows between a source electrode and a drain electrode when the gate voltage is lower than the threshold voltage. Further, in another expression, the off-state current is called the subthreshold current and can refer to a current which flows between a source electrode and a drain electrode when a gate potential and a source potential of a transistor are equal to each other.

A semiconductor layer including a channel formation region of the first transistor 102 and a semiconductor layer including a channel formation region of the second transistor 104 are formed using semiconductor materials different from each other. The first transistor 102 includes a first semiconductor layer 116 as its component, and the second transistor 104 includes a second semiconductor layer 132 as its component. The first semiconductor layer 116 is formed using a crystalline semiconductor and preferably includes a single crystal semiconductor. A transistor including the crystalline semiconductor can realize high field effect mobility, and thus can operate at high speed. The second semiconductor layer 132 is formed using a wide-gap semiconductor and preferably includes a few amount of donor impurities which is reduced so that the thermal excitation carrier density at room temperature is lower than or equal to $10^{18}/cm^3$. By reduction of the carrier density in the second semiconductor layer 132, the off-state current of the second transistor 104 can be reduced.

In the first transistor 102, a first insulating layer 124 serving as a gate insulating layer is formed on a surface of the first semiconductor layer 116, and a first gate electrode 126 is provided thereover. The first gate electrode 126 is insulated from the first semiconductor layer 116 by the first insulating layer 124, whereby a structure of the first transistor 102 is similar to a structure of an insulated-gate field-effect transistor.

The second semiconductor layer 132 including a channel region of the second transistor 104 is provided so as to extend from the first gate electrode 126 toward a first impurity region 122 of the first transistor 102. One of ends of the second semiconductor layer 132 is in contact with the first gate electrode 126, and the other end thereof is in contact with a contact plug 140. A third insulating layer 130 is provided on a side surface of the first gate electrode 126, whereby the second semiconductor layer 132 can be provided to have the end portions which are in contact with the first gate electrode 126 and the contact plug 140 provided over the first impurity region 122. The contact plug 140 also functions as an electrode which is in contact with the first impurity region 122 forming a source region or a drain region of the first transistor 102.

A second gate electrode 136 included in the second transistor 104 is provided to overlap with a portion where the second semiconductor layer 132 overlaps with the third insulating layer 130. A fourth insulating layer 134 serving as a gate insulating layer is provided between the second gate electrode 136 and the second semiconductor layer 132.

In the capacitor 106, the fourth insulating layer 134 is used as a dielectric film. The first gate electrode 126 has a function of one of electrodes between which this dielectric film is sandwiched. A capacitor electrode 138 is provided as the other electrode to face the first gate electrode 126. The capacitor 106 is provided to overlap with the first gate electrode 126 of the first transistor 102, which contributes to a reduction in area of the memory cell.

A first word line, a second word line, a common potential line, and a wiring to be a bit line are connected to the second gate electrode 136 of the second transistor 104, the capacitor electrode 138, a second impurity region 123 of the first transistor 102, and the contact plug 140, respectively, in the memory cell having the structure illustrated in FIG. 1, whereby a circuit similar to that of FIG. 2 can be formed. One of ends of the second semiconductor layer 132 in the second transistor 104 is electrically connected to the contact plug 140 and thus is also connected to the bit line as in the case of the first transistor 102.

The memory cell in the semiconductor memory device illustrated in FIG. 1 allows a structure in which the first transistor 102 and the second transistor 104 are provided to be close to each other. The capacitor 106 is provided to overlap with the first gate electrode 126 of first transistor 102, and the first gate electrode 126 also serves as one of electrodes included in the capacitor, so that the area of the memory cell can be reduced.

In order to make the first transistor 102 operate at high speed, the first semiconductor layer 116 is preferably formed using a single crystal semiconductor or alternatively formed using a polycrystalline semiconductor. As a typical single crystal semiconductor, a silicon semiconductor can be given, but another semiconductor material may be used. Therefore, the first semiconductor layer 116 may be a semiconductor-base substrate such as a silicon chip or be in a substrate having a so-called SOI structure in which a semiconductor layer is formed over an insulating layer.

In order to reduce the off-state current of the second transistor 104 to the level of 1 femtoampere ($1 \times 10^{-15}$ A), preferably 1 attoampere ($1 \times 10^{-18}$ A), further preferably 1 zeptoampere ($1 \times 10^{-21}$ A), the second semiconductor layer 132 is preferably formed using a semiconductor material whose band gap is wider than 1.12 eV of a silicon semiconductor. As a semiconductor material whose band gap is wider than that of a silicon semiconductor, a compound semiconductor such as an oxide semiconductor, a nitride semiconductor, or a carbide semiconductor, or a diamond thin film having semiconductor characteristics can be used. A semiconductor material whose band gap is wider than that of a silicon semiconductor and whose conductivity is intrinsic or substantially intrinsic is used, whereby the intrinsic carrier density of the semiconductor layer is lower than that of a silicon semiconductor, and thus the off-state current is reduced.

When the second semiconductor layer 132 is formed using an oxide semiconductor or an oxynitride semiconductor, portions where the contact plug 140 and the first gate electrode 126 are in contact with the second semiconductor layer 132 are preferably formed using a metal material which draws oxygen to be oxidized easily. Examples of such a metal material include titanium (Ti), molybdenum (Mo), and tungsten (W), and particularly, titanium is preferable. Such a metal material has a function of drawing oxygen from an oxide semiconductor and an oxynitride semiconductor. In other words, in the second semiconductor layer 132 which is in contact with the first gate electrode 126 and the contact plug 140, oxygen in the vicinity of the contact region is extracted, whereby defects of oxygen vacancy which functions as a donor are generated. As a result, contact resistance of the contact region can be reduced.

In the case where the amount of off-state current of the second transistor 104 is extremely small, loss of electric charges stored in the capacitor 106 in a short time, which is caused by the off-leakage current of the second transistor 104, can be prevented. Since the potential of the capacitor 106 is applied to the gate of the first transistor 102, the potential of the gate of the first transistor 102 can be held for an extremely long time.

Figure 3:
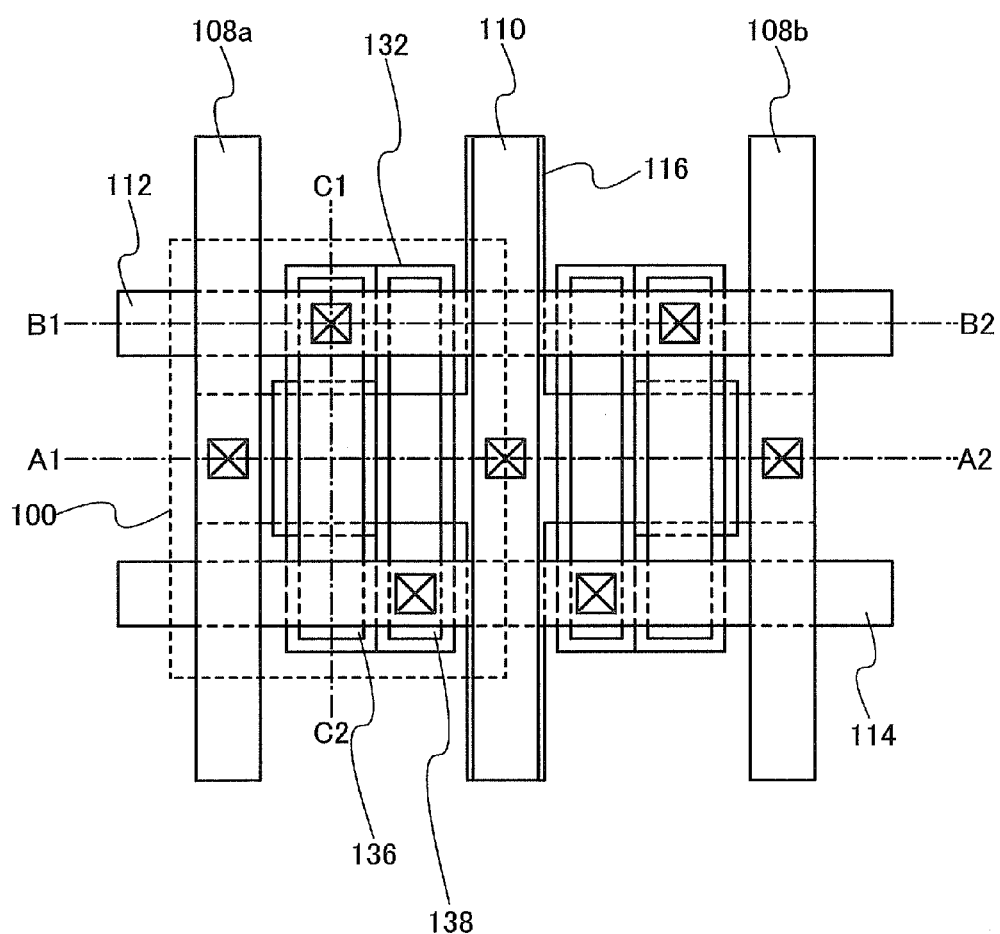
FIG. 3 is a plan view of a memory cell array in which memory cells are arranged in matrix.
Figure 4:
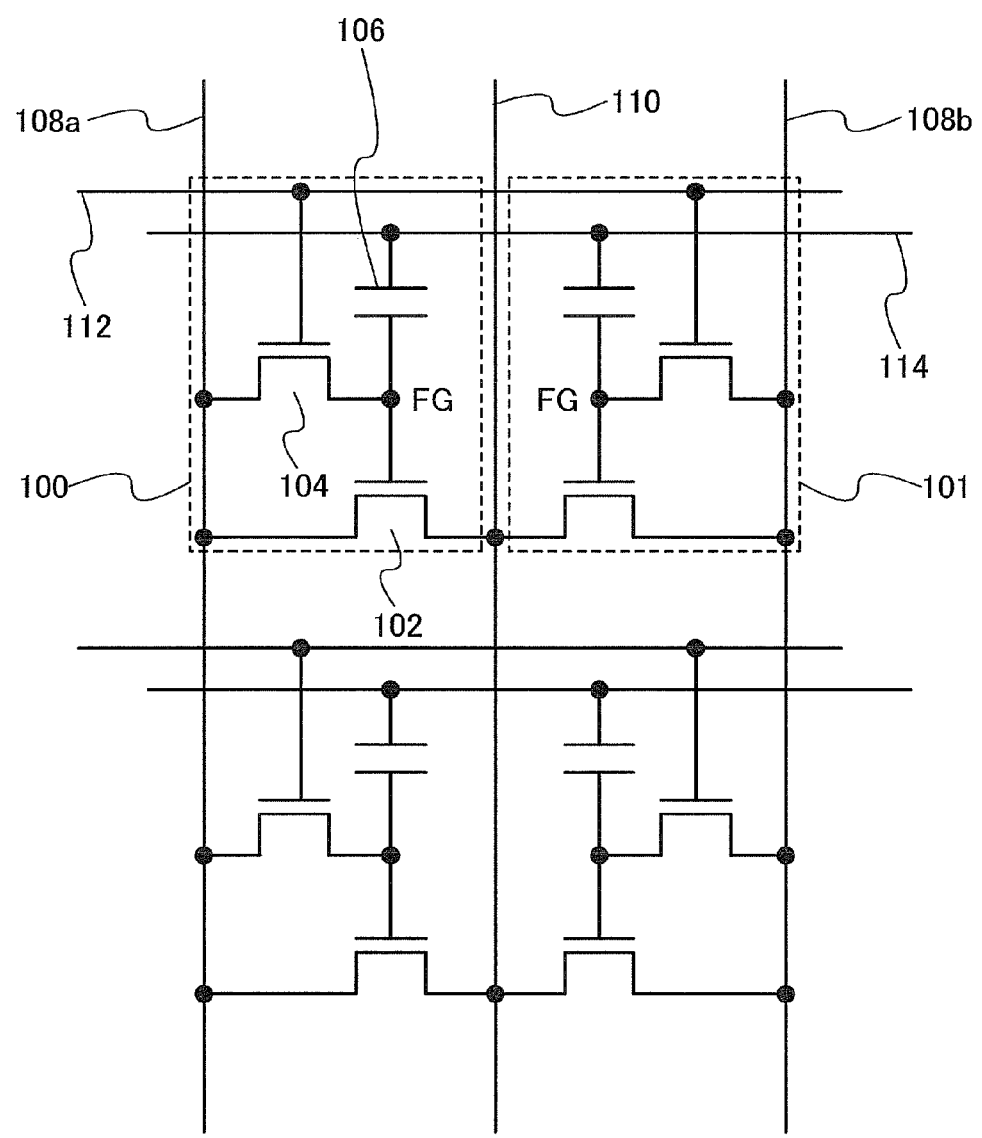
FIG. 4 is an equivalent circuit diagram of the memory cell array illustrated in FIG. 3.

The above memory cells 100 are used and arranged in matrix, so that a memory cell array can be formed. FIG. 3 is a plan view of a memory cell array (2×2) including the memory cells 100, and FIG. 4 shows an equivalent circuit thereof. The memory cell 100 illustrated in FIG. 3 shares the common potential line 110 with an adjacent memory cell. The second transistor 104 and the capacitor 106 are connected to word lines (the first word line 112 and the second word line 114) arranged in the row direction, and the first transistor 102 and the second transistor 104 are connected to bit lines (a bit line 108a and a bit line 108b) arranged in the column direction.

In FIG. 3, the first word line 112 and the second word line 114 are formed in one layer and are connected to the second gate electrode 136 and the capacitor electrode 138, respectively. The bit line 108a, the bit line 108b, and the common potential line 110 are formed in a layer different from the layer including the word lines. In a region surrounded by the word lines (the first word line 112 and the second word line 114), the bit line 108a, and the common potential line 110, the first transistor 102, the second transistor 104, and the capacitor 106 are provided to overlap with one another. Thus, the area occupied by the memory cell 100 is smaller than that in the case where elements are arranged horizontally.

Further, according to an example of FIG. 3, the number of contact holes necessary for connecting the word lines and the bit lines to the transistors and the like in the memory cell array (2×2) is only seven even when the memory cell 100 including two transistors and one capacitor is used. As described above, the structure of the memory cell illustrated in FIG. 1 makes it possible to reduce the number of contact holes needed for formation of the memory cell array, and in addition, the elements included in the memory cell 100 are provided to overlap one another; thus, storage capacity of the semiconductor memory device can be increased.

<Operation of Memory Cell>

In the memory cell shown in FIG. 4, when the off-state current of the second transistor 104 is extremely small, electric charges stored in the capacitor 106 can be held for a long time; thus, refresh operation (operation of rewriting storage data) need not be performed frequently, and writing data and reading data can be performed at high speed. In addition, power necessary for operation of the semiconductor memory device can be reduced.

Hereinafter, operation of writing and reading data to/from the memory cell 100 shown in FIG. 4 and a memory cell 101 having the same structure as the memory cell 100 is described. Here, in an example described below, data written to the memory cell 100 is data "1" and the data written to the memory cell 101 is data "0".

<Writing Operation>

A potential V1 is applied to the first word line 112, and the second transistor 104 of the memory cell 100 and the second transistor of the memory cell 101 are turned on. At this time, a potential V0 (=0 V) is given to the first word lines in the other rows, and the second transistors of the memory cells in the other rows are turned off. A potential V2 is applied to the bit line 108a, and a potential V3 (=0 V) is given to the bit line 108b. Note that the potential of the second word line 114 is 0 V. At this time, the common potential line 110 is given the potential V2.

In such a state, a floating gate portion FG in the memory cell 100 is supplied with the potential V2. Further, a floating gate portion FG in the memory cell 101 is supplied with the potential V3 (=0 V). Note that the potential V2 is higher than the threshold voltage of the first transistor. It is preferable that the potential V2 be substantially equal to the potential V1 or lower than or equal to the potential V1.

Then, the potential of the first word line 112 is set at 0 V, and the second transistor 104 of the memory cell 100 and the second transistor of the memory cell 101 are turned off, whereby writing operation is completed. When the writing is to be finished, the potential of the first word line 112 is set to 0 V before the potentials of the bit line 108a and the bit line 108b are made to change.

After the writing, the threshold voltage of the memory cell 100 to which data "1" is written is Vw1, and the threshold voltage of the memory cell 101 to which data "0" is written is Vw0. Here, the threshold voltage of the memory cell means the voltage of the second word line 114, with which the resistance between the source electrode and the drain electrode of the first transistor 102 changes. Note that the relation, Vw0>0>Vw1, is satisfied.

<Reading Operation>

A reading potential is applied to the second word line 114 connected to the memory cell 100 and the memory cell 101. The reading potential is, for example, 0 V. In the case where the second word line 114 is supplied with the reading potential, the first transistor 102 of the memory cell 100 is turned on, and the first transistor of the memory cell 101 is turned off.

At this time, a potential VL is applied to the second word lines in the other rows. The potential VL is lower than the threshold voltage Vw1. Thus, in the other memory cells, the first transistors are off regardless of whether data "1" or data "0" is written to the memory cells.

The predetermined potential (e.g., the potential V1) is applied to the bit line 108a and the bit line 108b in advance. The first transistor 102 of the memory cell 100 is in an on state; thus, conduction is established between the bit line 108a and the common potential line 110. On the other hand, the first transistor of the memory cell 101 is in an off state; thus, a conducting state is not established between the bit line 108b and the common potential line 110. During this reading operation, the potential of the common potential line 110 is 0 V. Thus, data can be read out by detecting the potentials of the bit line 108a and the bit line 108b with a sense amplifier. During this reading operation, the potential of the first word line 112 is 0 V, and the second transistor 104 is in an off state.

The second word lines connected to the other memory cells are set to have the potential VL. In order to prevent the second transistors from being turned on, potentials of the first word lines connected to the other memory cells are set to VL.

The operation potentials described above can be set as follows: V1=2 V, V2=1.5 V, VH=2 V, and VL=−2 V.

As in the memory cell array illustrated in FIG. 3 and FIG. 4, the memory cell 100 and the memory cell 101 share the common potential line, whereby the number of common potential lines can be reduced as compared to the number of bit lines. Thus, the integration density of the memory cell array can be improved.

<Example of Manufacturing Process>

An example of a manufacturing method of the memory cell array illustrated in FIG. 3 is described. Hereinafter, cross-sectional structures along lines A1-A2, B1-B2, and C1-C2 of FIG. 3 are used for description.

Figure 5A:
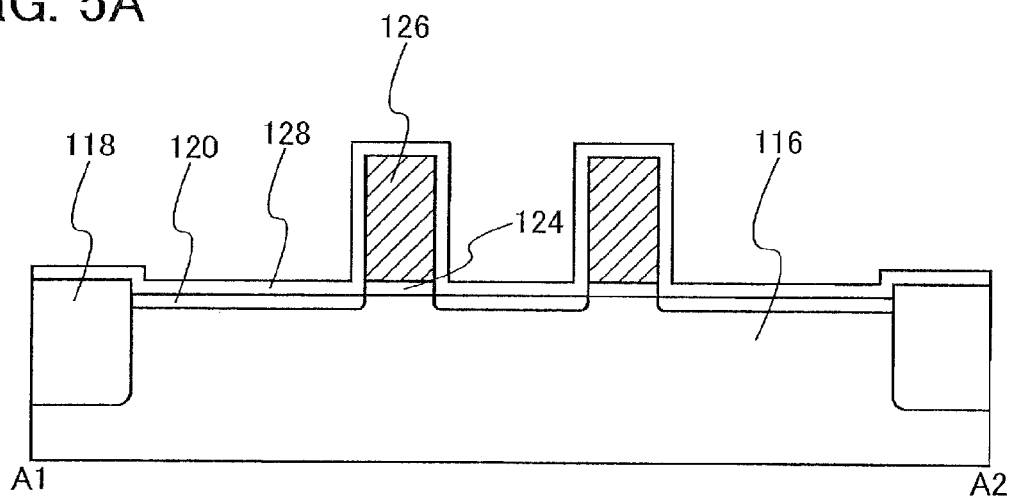
FIGS. 5A to 5C are cross-sectional views illustrating manufacturing steps of the memory cell array.
Figure 5B:
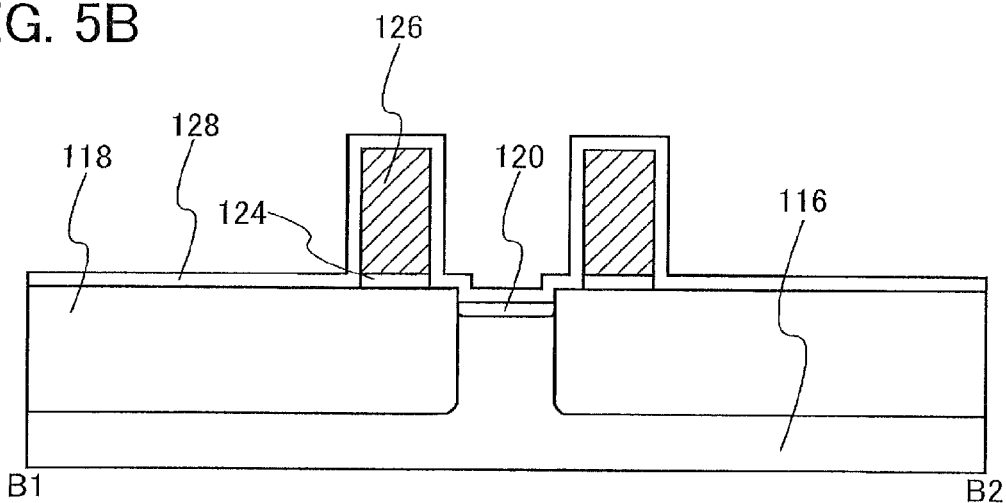
Figure 5C:
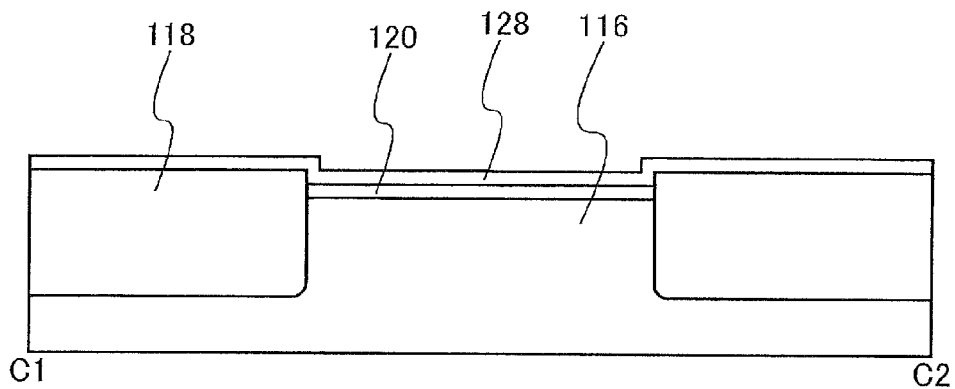

FIGS. 5A to 5C illustrate steps in which the gate electrode and the like of the first transistor are formed. FIG. 5A is a cross-sectional view taken along line A1-A2 of FIG. 3, FIG. 5B is a cross-sectional view taken along line B1-B2 of FIG. 3, and FIG. 5C is a cross-sectional view taken along line C1-C2 of FIG. 3 (FIG. 6A, FIG. 7A, FIG. 8A, and FIG. 9A are cross-sectional views taken along line A1-A2 of FIG. 3; FIG. 6B, FIG. 7B, FIG. 8B, and FIG. 9B are cross-sectional views taken along line B1-B2 of FIG. 3; and FIG. 6C, FIG. 7C, FIG. 8C, and FIG. 9C are cross-sectional views taken along line C1-C2 of FIG. 3).

The first semiconductor layer 116 is formed using a crystalline semiconductor. For example, the first semiconductor layer 116 is formed using a single crystal semiconductor substrate such as a silicon wafer. Alternatively, the first semiconductor layer 116 can be formed using an SOI (silicon on insulator) substrate in which a single crystal semiconductor layer is formed on an insulating surface. An element isolation layer 118 is provided so as to electrically separate transistors adjacent to each other, which prevents malfunction of the transistors.

The first insulating layer 124 serving as a gate insulating layer is formed over the first semiconductor layer 116. The first insulating layer 124 is formed to have a single-layer structure or a stacked structure using a film including any of silicon oxide, silicon oxynitride, silicon nitride, hafnium oxide, aluminum oxide, tantalum oxide, yttrium oxide, hafnium silicate (HfSi$_x$O$_y$ (x>0, y>0)), hafnium silicate (Hf-Si$_x$O$_y$ (x>0, y>0)) to which nitrogen is added, hafnium aluminate (HfAl$_x$O$_y$ (x>0, y>0)) to which nitrogen is added, and the like.

The first gate electrode 126 is formed using metal such as molybdenum, tungsten, titanium, or chromium or n-type or p-type doped silicon. Since an upper portion of the first gate electrode 126 is in contact with a semiconductor layer of the second transistor, a conductive material which can form ohmic contact with the semiconductor layer is preferably used. Therefore, the upper portion of the first gate electrode 126 may be formed using a metal material which can form ohmic contact with the semiconductor layer of the second transistor. For example, in the case where the semiconductor layer of the second transistor formed in a later step is formed using an oxide semiconductor containing zinc oxide, the lower portion of the first gate electrode 126 is preferably formed using polysilicon doped to have n-type conductivity, and a portion which is in contact with the semiconductor layer (the upper portion of the first gate electrode 126) is preferably formed using titanium, molybdenum, or tungsten.

FIG. 5A is a cross-sectional view of a portion where a channel region of the first transistor is formed, which illustrates a state in which the first insulating layer 124 and the first gate electrode 126 are provided over the first semiconductor layer 116 and a second insulating layer 128 is formed to cover the first insulating layer 124 and the first gate electrode 126. There is no restriction on a material of the second insulating layer 128. For example, when a silicon nitride film is used, oxidation of the first gate electrode 126 can be prevented.

A shallow impurity region 120 formed in the first semiconductor layer 116 serves as part of a source region or a drain region. The shallow impurity region 120 is formed to reach the vicinity of the first gate electrode 126 and called extension. With the shallow impurity region 120, an increase in the off-state current is suppressed even when the channel length is small, and thus the on/off ratio of the transistor can be increased.

FIG. 5B illustrates the outside of the first transistor, where the first gate electrode 126 extends over the element isolation layer 118. FIG. 5C illustrates a cross section of a region where the second transistor is formed and the gate electrode of the first transistor is not formed. Further, FIG. 5C illustrates a region where the second transistor is to be formed in a later step, but in this stage, only the element isolation layer 118, the shallow impurity region 120, and the second insulating layer 128 are formed.

Figure 6A:
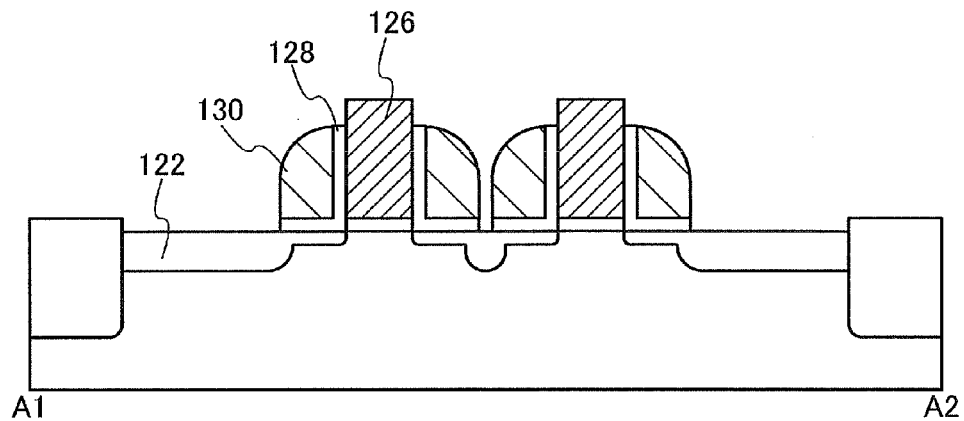
FIGS. 6A to 6C are cross-sectional views illustrating manufacturing steps of the memory cell array.
Figure 6B:
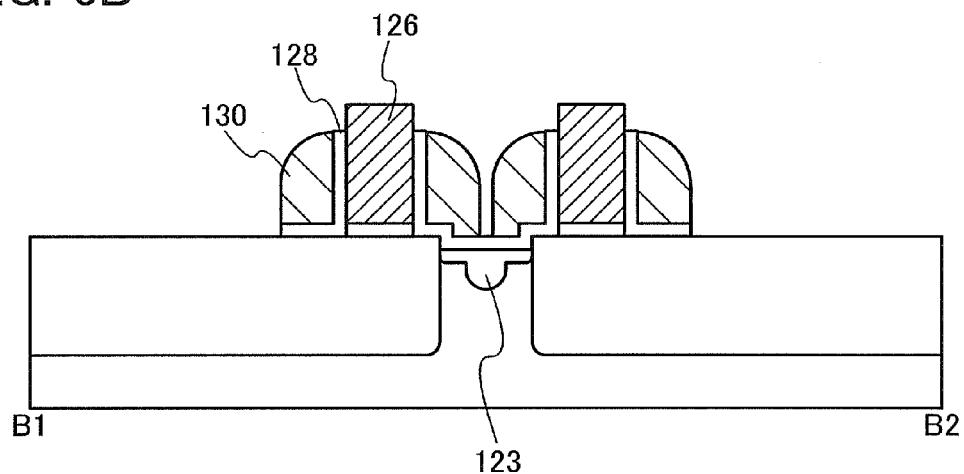
Figure 6C:
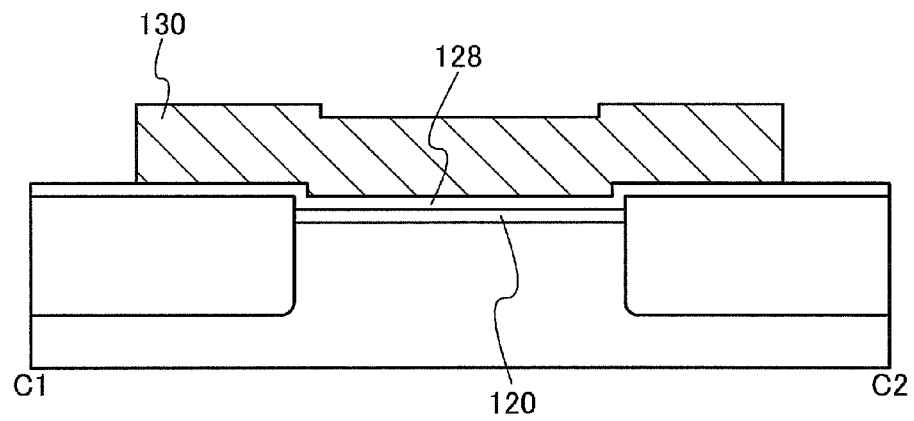

FIGS. 6A, 6B, and 6C each illustrate a stage where the third insulating layer 130 is formed on a side wall portion of the first gate electrode 126. A preferable material of the third insulating layer 130 is silicon oxide but may be another insulating material such as silicon nitride. The third insulating layer 130 is formed as follows: an insulating layer is formed so that the first gate electrode 126 is embedded therein; and the insulating layer is anisotropically etched so that the insulating layer is left on the side wall portion of the first gate electrode 126. Thus, the third insulating layer 130 is formed in a self-aligned manner on the side wall portion of the first gate electrode 126. In addition, at this stage, etching of the second insulating layer 128 is performed so that an upper portion of the first gate electrode 126 is exposed.

The first impurity region 122 and the second impurity region 123 which form a source region and a drain region are formed in the first semiconductor layer 116. The first impurity region 122 and the second impurity region 123 are formed by adding a donor impurity such as phosphorus or arsenic in the case of an n-channel transistor (in the case where a p-channel transistor is formed, an acceptor impurity such as boron is added). In this step, the first gate electrode 126 and the third insulating layer 130 serve as a mask blocking the dopant. Thus, the first impurity region 122 and the second impurity region 123 are formed in a self-aligned manner. A portion of the first semiconductor layer 116 at which the dopant is added is deeper than the shallow impurity region 120. Thus, resistance of the first impurity region 122 and the second impurity region 123 can be low.

Figure 7A:
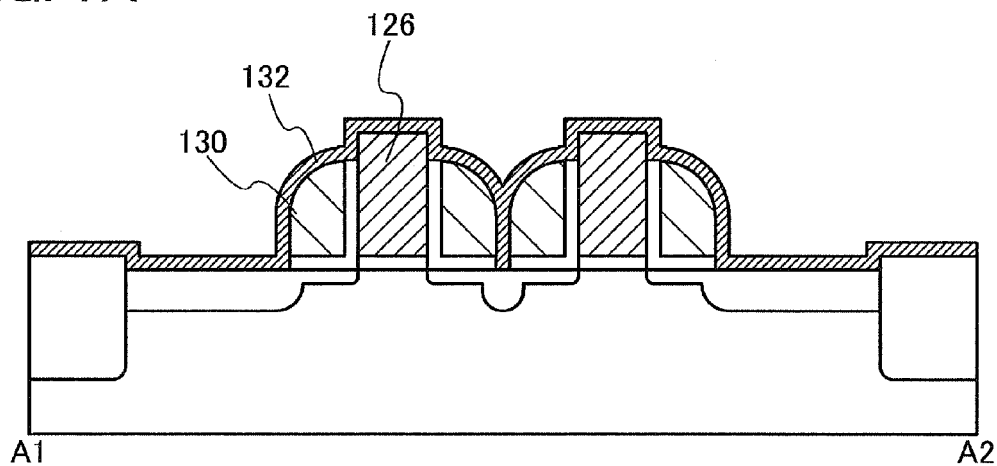
FIGS. 7A to 7C are cross-sectional views illustrating manufacturing steps of the memory cell array.
Figure 7B:
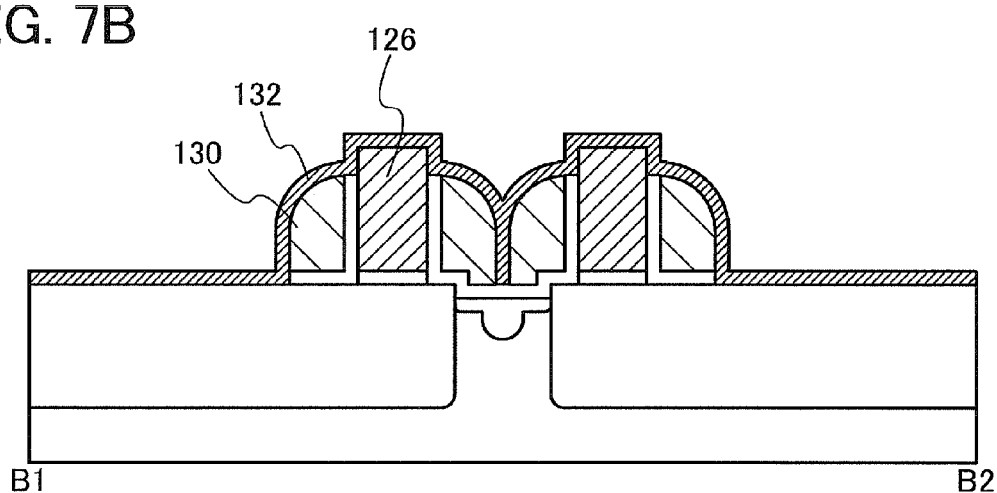
Figure 7C:
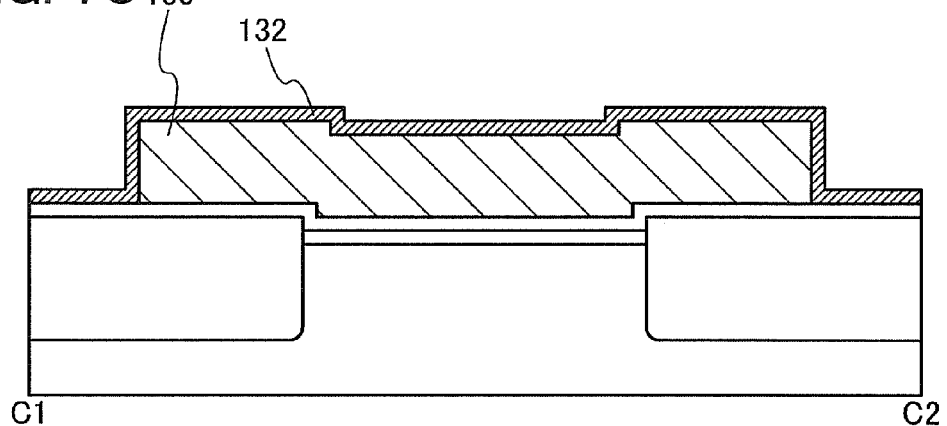

FIGS. 7A, 7B, and 7C each illustrate a stage in which the second semiconductor layer 132 is formed. The second semiconductor layer 132 is provided for formation of the second transistor. The second semiconductor layer 132 is formed to cover the first gate electrode 126, the third insulating layer 130, the first impurity region 122, and the second impurity region 123.

The second semiconductor layer 132 is formed using a semiconductor material whose band gap is wider than 1.12 eV of a silicon semiconductor. For example, a semiconductor material whose band gap is 2.5 eV or more, preferably 3.0 eV or more, is used. As such a semiconductor, an oxide semiconductor, a nitride semiconductor, a carbide semiconductor, or a diamond thin film having semiconductor characteristics can be used.

As an oxide semiconductor, a four-component metal oxide such as In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor, an In—O-based oxide semiconductor, a Sn—O-based oxide semiconductor, a Zn—O-based oxide semiconductor, or the like can be used.

For example, an In—Ga—Zn—O-based oxide semiconductor material can have sufficiently high resistance when there is no electric field, and thus enables the off-state current to be sufficiently reduced. In addition, the field-effect mobility is high, so that the In—Ga—Zn—O-based oxide semiconductor material is suitable for the semiconductor material used in the semiconductor device. As a typical example of the In—Ga—Zn—O-based oxide semiconductor material, one represented by $InGaO_3(ZnO)_m$ (m>0) is given. Another element instead of Ga can be employed in such an oxide semiconductor material, and the oxide semiconductor material which is generalized can be represented by $InMO_3(ZnO)_m$ (m>0). Here, M denotes one or more metal elements selected from gallium (Ga), aluminum (Al), iron (Fe), nickel (Ni), manganese (Mn), cobalt (Co), or the like. For example, M can be Ga, Ga and Al, Ga and Fe, Ga and Ni, Ga and Mn, Ga and Co, or the like. Note that the above-described compositions are derived from the crystal structures that the oxide semiconductor material can have and are only examples.

In the case where the oxide semiconductor film is formed by a sputtering method, a target which is represented by a composition formula: In:Ga:Zn=1:x:y (x is greater than or equal to 0 and y is greater than or equal to 0.5 and less than or equal to 5), is preferably used. For example, a target whose composition ratio of In, Ga, and Zn is 1:1:1 [atomic ratio] (x=1 and y=1; that is, $In_2O_3:Ga_2O_3:ZnO=1:1:2$ [molar ratio]) can be used. In addition, a target having a composition ratio where In:Ga:Zn=1:1:0.5 [atomic ratio] (x=1, y=0.5), a target having a composition ratio where In:Ga:Zn=1:1:2 [atomic ratio] (x=1, y=2), or a target having a composition ratio where In:Ga:Zn=1:0:1 [atomic ratio] (x=0, y=1) can also be used.

As illustrated in FIGS. 7A to 7C, when an oxide semiconductor film is formed as the second semiconductor layer 132 by a sputtering method over a substrate where the transistor is formed with the first semiconductor layer 116, the substrate heating temperature in film deposition may be about room temperature to 500° C. Thus, an aluminum alloy with low heat resistance can be used for the first gate electrode 126, and impurity elements added to the shallow impurity region 120, the first impurity region 122, and the second impurity region 123 formed in the first semiconductor layer 116 do not diffuse and there is no change in concentration distribution of the impurity elements. Note that the second semiconductor layer 132 is formed to a thickness of 10 nm to 100 nm, preferably 20 nm to 50 nm.

Figure 8A:
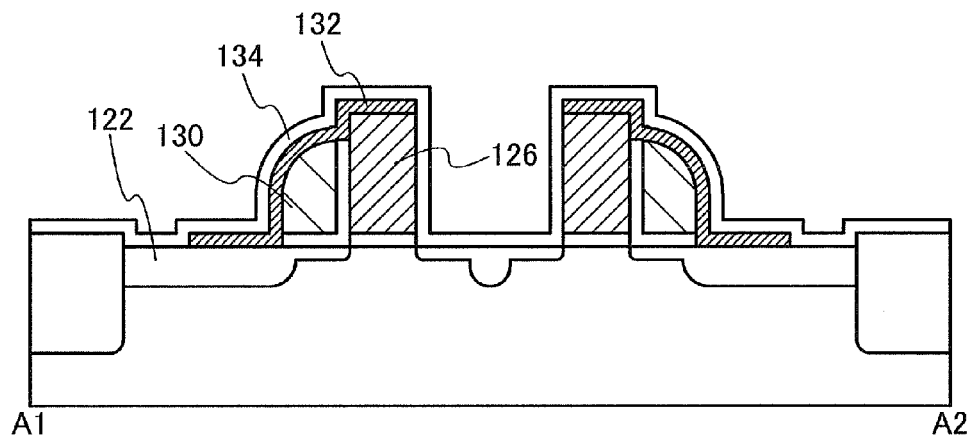
FIGS. 8A to 8C are cross-sectional views illustrating manufacturing steps of the memory cell array.
Figure 8B:
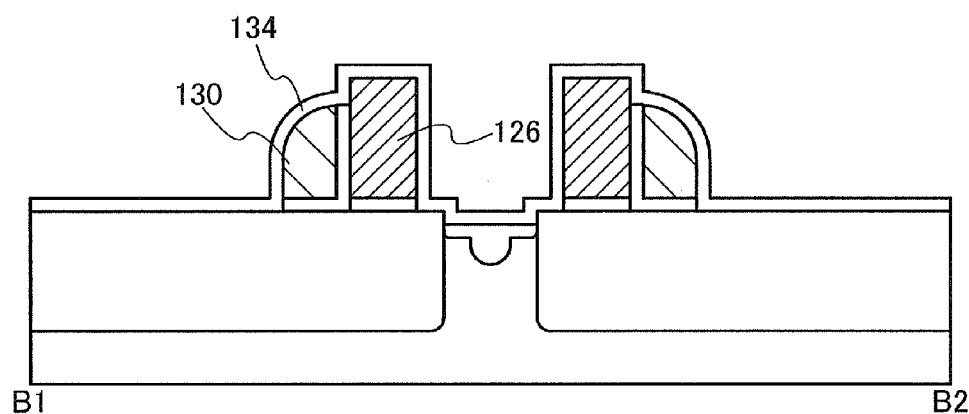
Figure 8C:
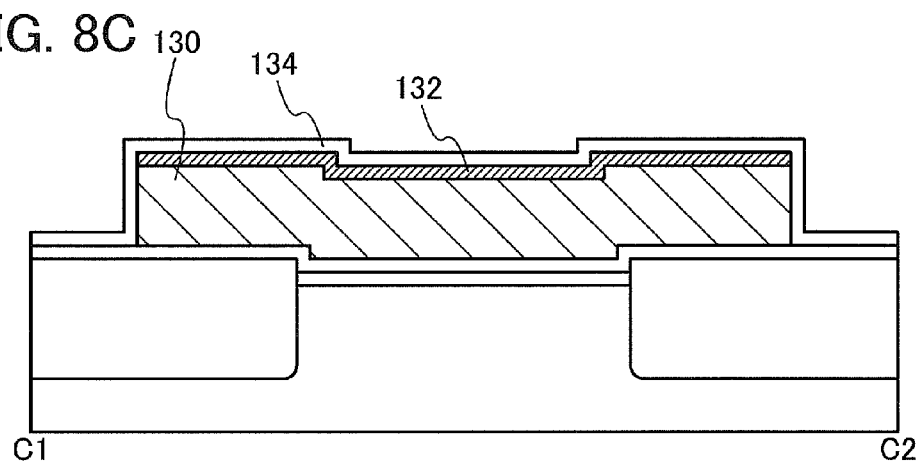

FIGS. 8A, 8B, and 8C each illustrate a stage where the second semiconductor layer 132 is separated so as to correspond to a portion where the second transistor is formed, and the fourth insulating layer 134 which is used as a gate insulating layer is formed. The second semiconductor layer 132 which has been separated is provided along the third insulating layer 130, and one of ends of the second semiconductor layer 132 is in contact with the first gate electrode 126 and the other end is in contact with the first impurity region 122.

In order to process the second semiconductor layer 132 as described above, a mask is formed over the second semiconductor layer 132, and etching process is performed. Note that in this etching process, the mask formed over the second semiconductor layer 132 may be successively used, whereby the third insulating layer 130 left on the inner sides of a pair of the first gate electrodes 126 may be removed. This is because the second semiconductor layer 132 is not left in this region, and thus the third insulating layer 130 is not necessarily provided.

The fourth insulating layer 134 is formed to cover the entire surface of the second semiconductor layer 132. In addition, the fourth insulating layer 134 is formed to cover an upper portion of the first gate electrode 126, thereby being used as a dielectric film of the capacitor. The fourth insulating layer 134 is preferably formed using an oxide insulating material such as silicon oxide, aluminum oxide, tantalum oxide, hafnium oxide, yttrium oxide, or hafnium silicate ($HfSi_xO_y$ (x>0, y>0)). There is no restriction on the thickness of the fourth insulating layer 134, but the fourth insulating layer 134 is preferably thin in the case where the transistor is miniaturized. For example, in the case where silicon oxide is used, the thickness can be set to greater than or equal to 1 nm and less than or equal to 100 nm, preferably greater than or equal to 10 nm and less than or equal to 50 nm. When the gate insulating layer is thin, gate leakage due to a tunneling effect or the like becomes a problem. In order to solve the problem of gate leakage, a high dielectric constant (high-k) material such as hafnium oxide, tantalum oxide, yttrium oxide, or hafnium silicate ($HfSi_xO_y$ (x>0, y>0)) may be used.

Figure 9A:
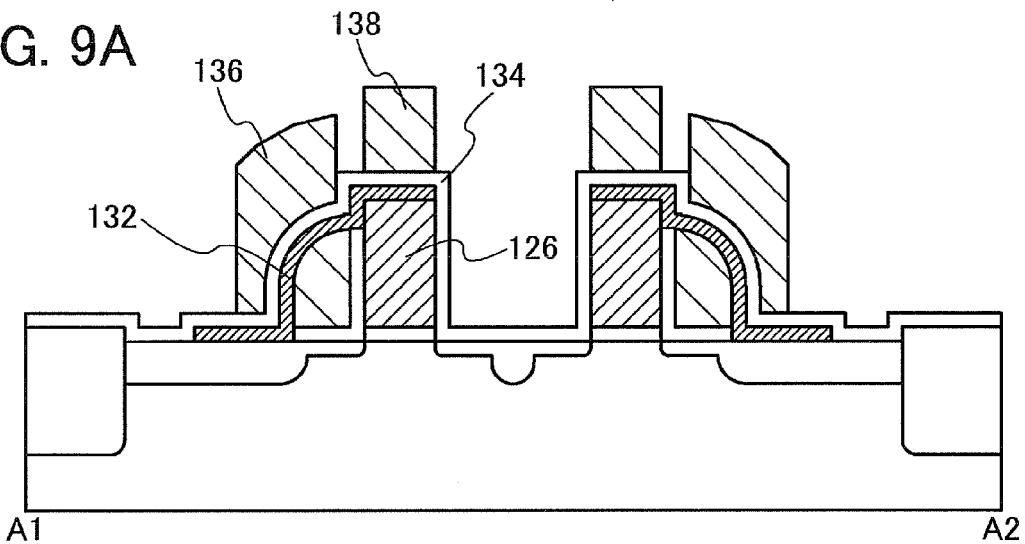
FIGS. 9A to 9C are cross-sectional views illustrating manufacturing steps of the memory cell array.
Figure 9B:
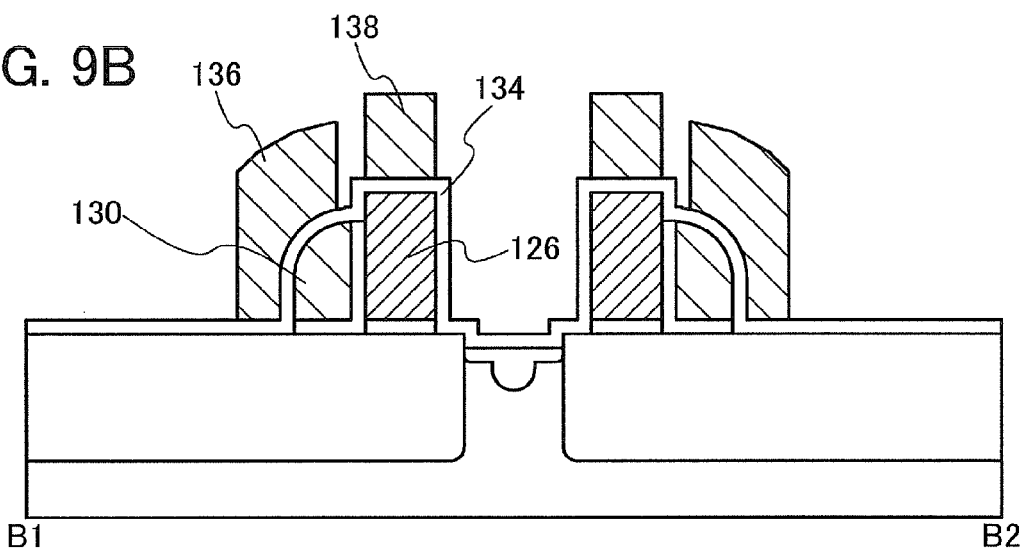
Figure 9C:
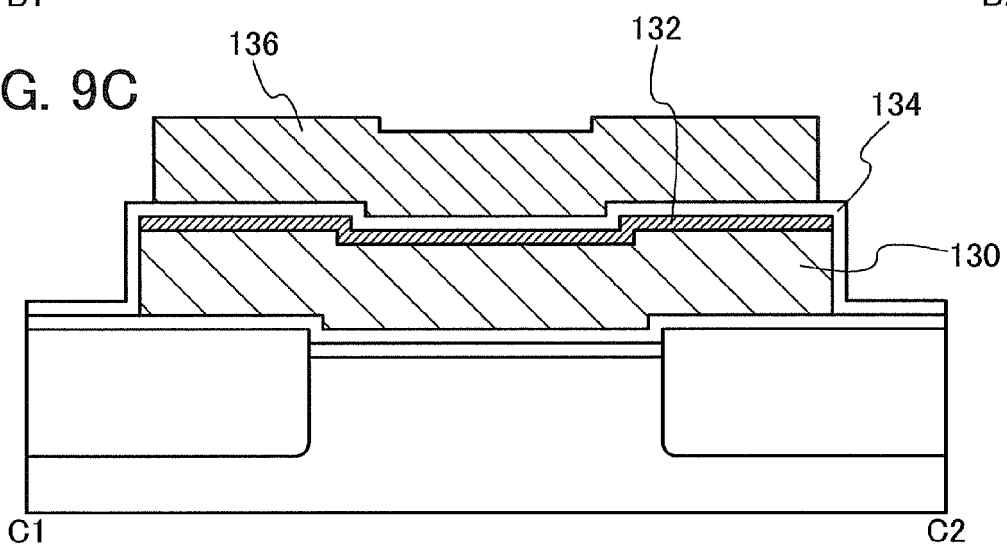

FIGS. 9A, 9B, and 9C each illustrate a stage where the gate electrode of the second transistor and the electrode of the capacitor are formed. The second gate electrode 136 of the second transistor is formed obliquely above the first gate electrode 126 of the first transistor. That is, the second gate electrode 136 is formed over a portion where the second semiconductor layer 132 extends from the first gate electrode 126 toward the first impurity region 122, specifically a portion where the second semiconductor layer 132 overlaps with the third insulating layer 130; in other words, the second gate electrode 136 is formed to overlap with the fourth insulating layer 134. The second gate electrode 136 included in the second transistor and the capacitor electrode 138 included in the capacitor are provided as described above, whereby the first transistor and the second transistor can be provided to be extremely close to each other.

The channel length and the channel width of the second transistor can be controlled by a shape of the third insulating layer 130 formed on the side wall of the first gate electrode 126. The length of the second semiconductor layer 132 over a portion between the first gate electrode 126 and the first impurity region 122 can be controlled to a certain extent by the height of the first gate electrode 126. In any case, the structure of this embodiment is preferable in order to miniaturize the second transistor.

The capacitor electrode 138 is provided to overlap with the first gate electrode 126 with the fourth insulating layer 134 interposed therebetween. The capacitor is provided to overlap with the first transistor; thus, the projected area part of which is occupied by the capacitor in the memory cell can be almost ignored. Since the second gate electrode 136 of the second transistor and the capacitor electrode 138 are formed with use of the same photomask, even when there is misalignment, the second gate electrode 136 and the capacitor electrode 138 are not in contact with each other and are not short-circuited.

Figure 10:
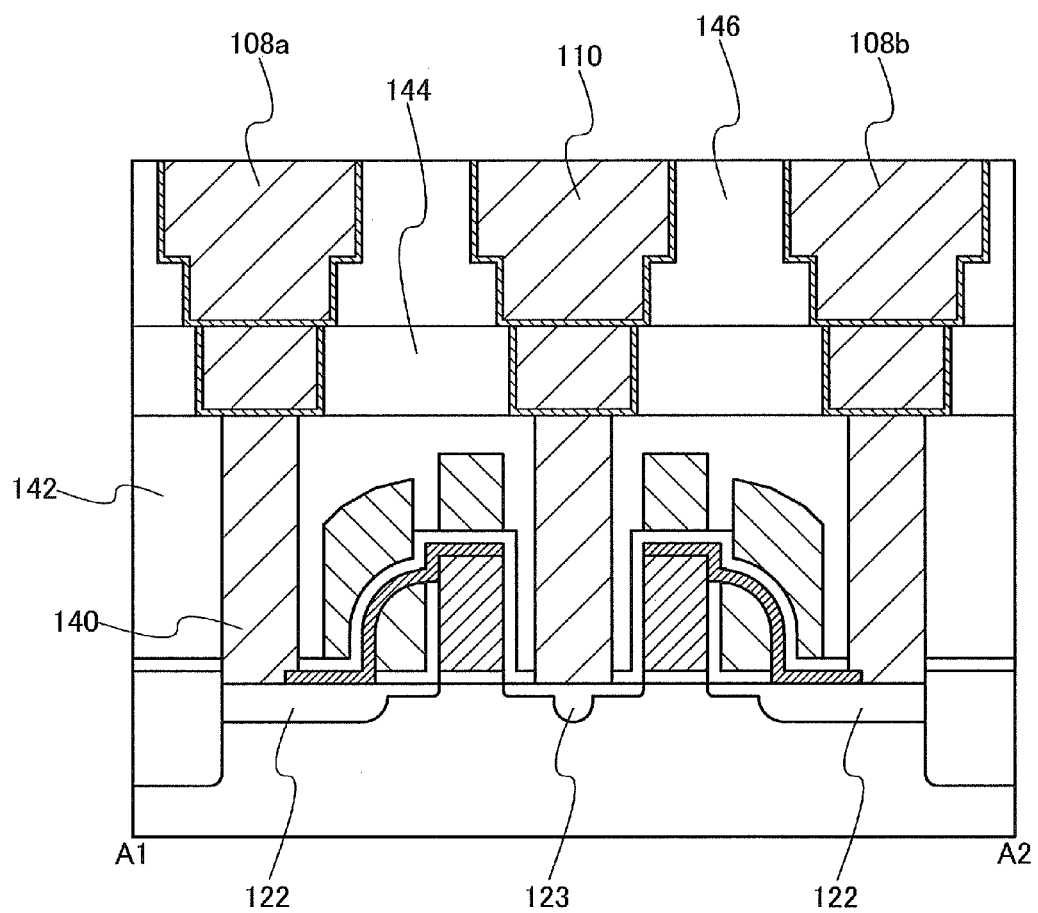
FIG. 10 is a cross-sectional view illustrating a manufacturing step of the memory cell array.
Figure 11:
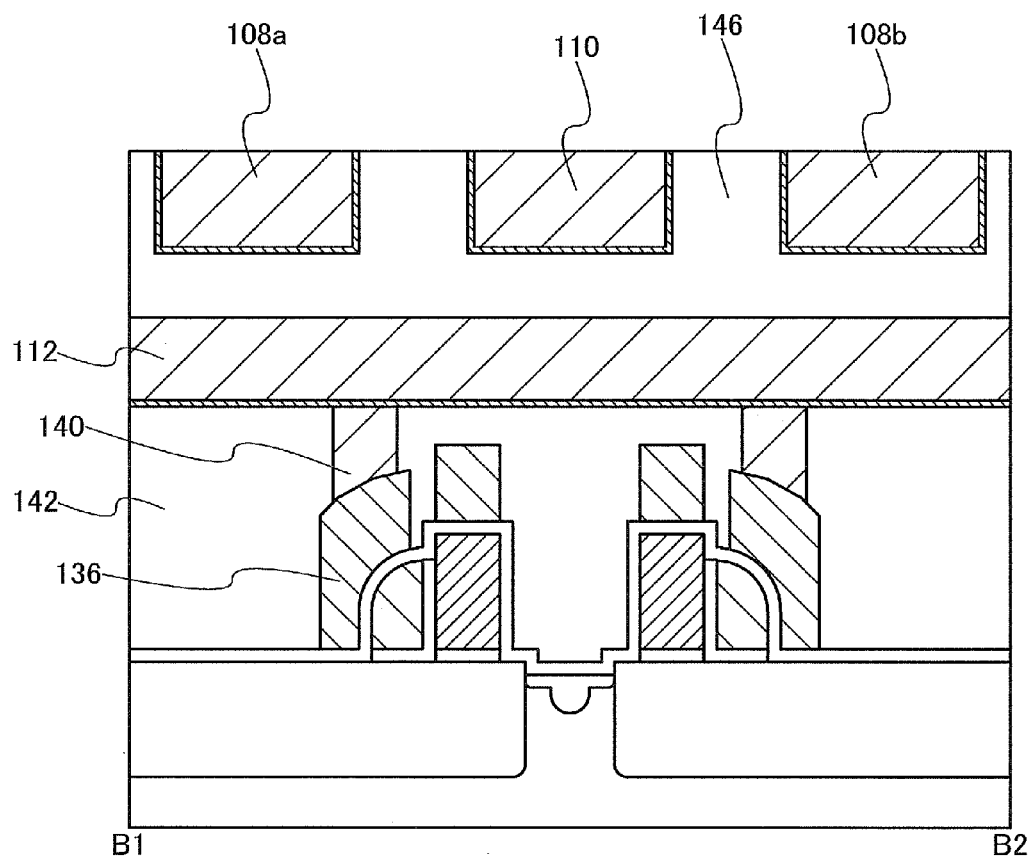
FIG. 11 is a cross-sectional view illustrating a manufacturing step of the memory cell array.
Figure 12:
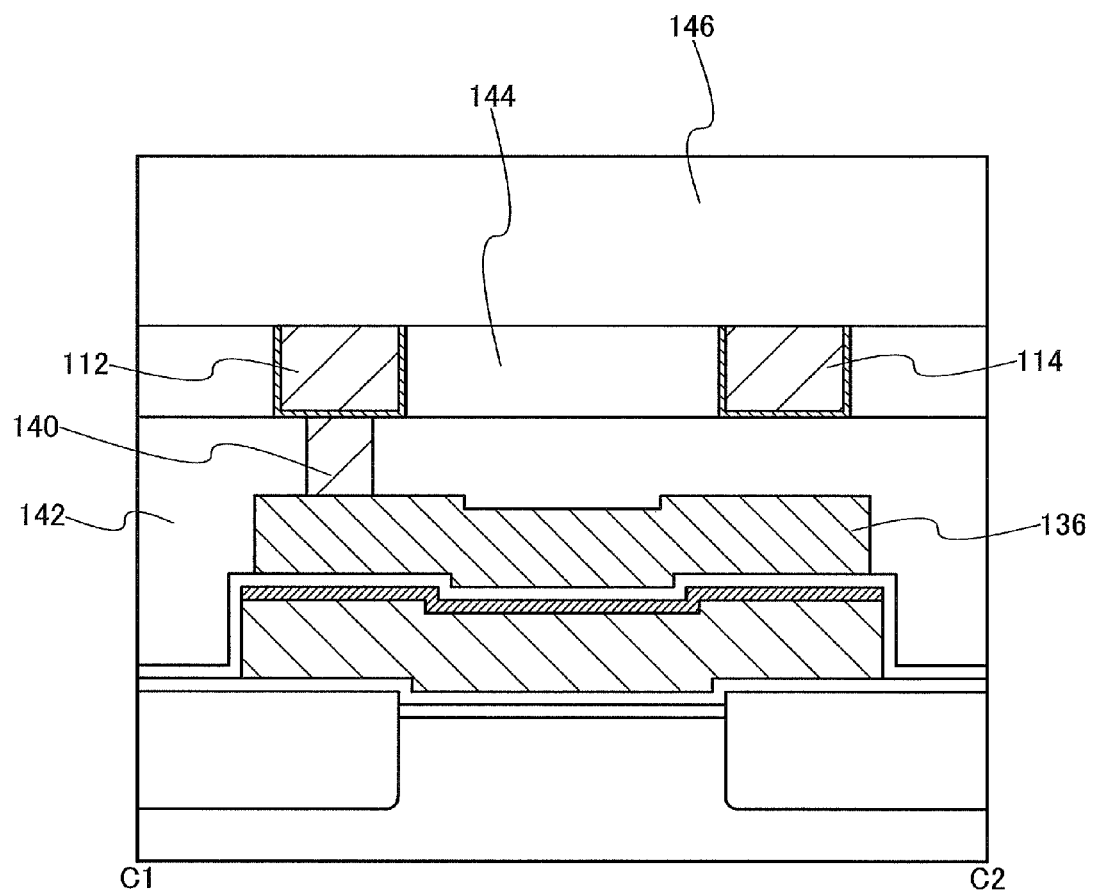
FIG. 12 is a cross-sectional view illustrating a manufacturing step of the memory cell array.

FIG. 10, FIG. 11, and FIG. 12 each illustrate a stage where a wiring is formed. FIG. 10 is a cross-sectional view along line A1-A2 of FIG. 3, FIG. 11 is a cross-sectional view along line B1-B2 of FIG. 3, and FIG. 12 is a cross-sectional view along line C1-C2 of FIG. 3.

A fifth insulating layer 142 is an interlayer insulating layer in which the first transistor, the second transistor, and the capacitor are embedded. The contact plug 140 which is in contact with the first impurity region 122 is formed using metal such as tungsten. The contact plug 140 is formed as follows: by a chemical vapor deposition (CVD) method using tungsten hexafluoride or the like as a reaction gas, a tungsten film is deposited so that a contact hole formed in the fifth insulating layer 142 is filled therewith. In this case, before the tungsten film is deposited, a metal film using titanium, molybdenum, or the like may be formed as a barrier metal. After the tungsten film is formed over the fifth insulating layer 142, the tungsten film is ground by chemical mechanical polishing (CMP) treatment, so that a surface of the fifth insulating layer 142 is planarized. Thus, the contact plug 140 is embedded in the fifth insulating layer 142. The contact plug 140 is connected to the bit line 108a, the bit line 108b, the common potential line 110, the first word line 112, and the second word line 114 formed thereover. The first word line 112 and the second word line 114 are embedded in a sixth insulating layer 144, and the bit line 108a, the bit line 108b, and the common potential line 110 are embedded in a seventh insulating layer 146.

As described above, the memory cell array illustrated in FIG. 3 can be manufactured. According to the above manufacturing method, the second transistor which controls writing data to the memory cell is provided so as to extend from the gate electrode toward the source region of the MOS transistor, whereby the area occupied by one memory cell can be decreased. Therefore, since the first transistor and the second transistor are provided to overlap with each other even in the case where two transistors are needed to form one memory cell, the memory cell can be formed without an increase in the area per cell.

<Second Transistor>

The second transistor including the second semiconductor layer 132 needs to have the small off-state current. For example, when the off-state current of the second transistor 104 is 10 zA (1 zA (zeptoampere) is $1 \times 10^{-21}$ A) or less at room temperature (25° C.) and the capacitance value of the capacitor 106 is approximately 10 fF, data can be stored for at least $10^4$ seconds.

The transistor with the extremely small off-state current can be obtained by reducing the concentration of impurities in the second semiconductor layer 132 so as to make the second semiconductor layer 132 close to an intrinsic semiconductor. Hereinafter, an example of increasing the purity of the second semiconductor layer 132 formed using an oxide semiconductor is described.

An oxide semiconductor is an oxide of one or a plurality of elements selected from indium, gallium, zinc, or tin. That is, an element other than the above elements included in the oxide semiconductor can be regarded as impurities. For example, hydrogen is known to serve as a donor when it is contained in an oxide semiconductor. Hydrogen or a hydroxyl group entering a film at a time of film formation is considered to be hydrogen contained in an oxide semiconductor. A residual gas in a chamber where an oxide semiconductor film is formed is considered as one of factors of the source of hydrogen and a hydroxyl group, and such a gas unavoidably enters the film.

In order to remove hydrogen or a hydroxyl group contained as an impurity in the oxide semiconductor film, heat treatment is preferably performed. By heat treatment, excess hydrogen (including water and a hydroxyl group) in the oxide semiconductor film is removed, and then, oxygen is supplied to the oxide semiconductor film to repair defects; thus, an oxide semiconductor with high resistance can be obtained.

The temperature of the heat treatment at which the above effect can be obtained is higher than or equal to 250° C. and lower than 550° C., preferably higher than or equal to 300° C. and lower than or equal to 550° C. A preferable atmosphere where the heat treatment is performed is an inert gas atmosphere, a nitrogen atmosphere, or air where the dew point is lower than or equal to −30° C. because if hydrogen or moisture is contained in the atmosphere of heat treatment, the hydrogen or moisture enters the oxide semiconductor. Thus, even in the case where the atmosphere is an inert gas atmosphere or a nitrogen atmosphere, it is not preferable that the atmosphere contain hydrogen or moisture. The purity of an inert gas such as nitrogen, helium, neon, or argon needs to be greater than or equal to 6N (99.9999%), preferably greater than or equal to 7 N (99.99999%) (that is, the impurity concentration is lower than or equal to 1 ppm, preferably lower than or equal to 0.1 ppm).

With the above treatment, hydrogen which could act as a donor is removed from the oxide semiconductor, whereby an intrinsic or substantially intrinsic oxide semiconductor can be obtained.

The above heat treatment can be referred to as dehydration treatment, dehydrogenation treatment, or the like because of its advantageous effect of removing hydrogen, moisture, and the like. The dehydration treatment or dehydrogenation treatment can be performed, for example, after the oxide semiconductor layer is formed, after the gate insulating layer is formed, or after the gate electrode is formed. Such dehydration treatment or dehydrogenation treatment may be conducted once or plural times.

The oxide semiconductor from which hydrogen and moisture are removed by the heat treatment has many defects caused by the removal of hydrogen and moisture. The defects in the oxide semiconductor need to be repaired by supply of oxygen. For example, the oxide semiconductor is subjected to heat treatment in a high-purity oxygen atmosphere from which hydrogen and moisture are removed. Alternatively, after formation of the fourth insulating layer 134, heat treatment is preferably performed in an inert gas atmosphere or an oxygen atmosphere. The temperature of the heat treatment is set higher than or equal to 200° C. and lower than or equal to 450° C., preferably higher than or equal to 250° C. and lower than or equal to 350° C. For example, the heat treatment may be performed at 250° C. for 1 hour in a nitrogen atmosphere. By performing the heat treatment, variation in electrical characteristics among transistors can be reduced. Further, in the case where the fourth insulating layer 134 includes oxygen excessively, oxygen can be supplied to the second semiconductor layer 132 to compensate oxygen defects, so that an intrinsic semiconductor or a substantially semiconductor can be obtained.

This application is based on Japanese Patent Application serial no. 2010-259547 filed with Japan Patent Office on Nov. 19, 2010, the entire contents of which are hereby incorporated by reference.

What is claimed is:

1. A semiconductor memory device comprising a memory cell, the memory cell comprising:
a first transistor, the first transistor comprising:
a first semiconductor layer in which a first impurity region and a second impurity region are formed;
a first gate electrode formed over the first semiconductor layer;
a first insulating layer formed between the first gate electrode and the first semiconductor layer; and
a second insulating layer and a third insulating layer formed on a side wall portion of the first gate electrode;
a second transistor, the second transistor comprising:
a second semiconductor layer formed on the third insulating layer, wherein the second semiconductor layer is in contact with the first electrode and the first impurity region;
a fourth insulating layer on the second semiconductor layer, the fourth insulating layer extending over an upper surface of the first gate electrode; and
a second gate electrode formed over the second semiconductor layer with the fourth insulating layer interposed therebetween; and
a capacitor comprising the first gate electrode, the fourth insulating layer over the first gate electrode, and an electrode formed over the first gate electrode with a portion of the fourth insulating layer interposed therebetween.

2. The semiconductor memory device according to claim 1, wherein one of ends of the second semiconductor layer is in contact with the first gate electrode, and the other end is in contact with a contact plug in contact with the first impurity region.

3. The semiconductor memory device according to claim 1, wherein the first semiconductor layer comprises a silicon semiconductor, and
wherein the second semiconductor layer comprises an oxide semiconductor.

4. The semiconductor memory device according to claim 1, wherein the second semiconductor layer comprises an oxide semiconductor, and
wherein the oxide semiconductor contains zinc oxide as one of main component.

5. A semiconductor memory device comprising:
a first transistor, the first transistor comprising:
a first semiconductor layer in which a first impurity region and a second impurity region forming a source region and a drain region are formed;
a first gate electrode formed over the first semiconductor layer;
a first insulating layer formed between the first gate electrode and the first semiconductor layer; and
a second insulating layer and a third insulating layer formed on a side wall portion of the first gate electrode;
a second transistor, the second transistor comprising:
a second semiconductor layer formed on the third insulating layer, wherein the second semiconductor layer is in contact with the first electrode and the first impurity region;
a fourth insulating layer on the second semiconductor layer, the fourth insulating layer extending over an upper surface of the first gate electrode; and
a second gate electrode formed over the second semiconductor layer and the fourth insulating layer so as to overlap with the third insulating layer; and
a capacitor comprising the first gate electrode, the fourth insulating layer over the first gate electrode, and an electrode formed to over the first gate electrode with a portion of the fourth insulating layer interposed therebetween,
wherein the first impurity region is connected to a bit line,
wherein the second impurity region is connected to a common potential line,
wherein the second gate electrode is connected to a first word line, and
wherein the electrode of the capacitor is connected to a second word line.

6. The semiconductor memory device according to claim 5, wherein one of ends of the second semiconductor layer is in contact with the first gate electrode, and the other end is in contact with a contact plug in contact with the first impurity region.

7. The semiconductor memory device according to claim 5, wherein the first semiconductor layer comprises a silicon semiconductor, and
wherein the second semiconductor layer comprises an oxide semiconductor.

8. The semiconductor memory device according to claim 5, wherein the second semiconductor layer comprises an oxide semiconductor, and
wherein the oxide semiconductor contains zinc oxide as one of main component.

* * * * *